US009658438B2

(12) United States Patent
Forrester et al.

(10) Patent No.: US 9,658,438 B2
(45) Date of Patent: May 23, 2017

(54) NON-IMAGING SOLAR CONCENTRATOR AND COSINE FACTOR CORRECTION DEVICE USING COMPOUND POLYHEDRAL SURFACES AND METHOD OF USE THEREOF

(71) Applicant: Litricity, LLC, Reno, NV (US)

(72) Inventors: Thomas C. Forrester, Torrance, CA (US); Mark Bennahmias, Ladera Ranch, CA (US); Robert S. Block, Reno, NV (US); Paul Sidlo, Santa Monica, CA (US); Rudolf A. Wiedemann, Reno, NV (US)

(73) Assignee: LITRICITY, LLC., Reno, NV (US)

( * ) Notice: Subject to any disclaimer, the term of this patent is extended or adjusted under 35 U.S.C. 154(b) by 0 days.

(21) Appl. No.: 14/766,651

(22) PCT Filed: Feb. 12, 2014

(86) PCT No.: PCT/US2014/015984
§ 371 (c)(1),
(2) Date: Aug. 7, 2015

(87) PCT Pub. No.: WO2014/126983
PCT Pub. Date: Aug. 21, 2014

(65) Prior Publication Data
US 2015/0370055 A1    Dec. 24, 2015

Related U.S. Application Data

(60) Provisional application No. 61/764,110, filed on Feb. 13, 2013.

(51) Int. Cl.
*G02B 5/04* (2006.01)
*G02B 19/00* (2006.01)
(Continued)

(52) U.S. Cl.
CPC .......... *G02B 19/0042* (2013.01); *F24J 2/085* (2013.01); *G02B 5/045* (2013.01);
(Continued)

(58) Field of Classification Search
CPC  G02B 19/0042; G02B 19/0009; G02B 19/00; G02B 19/0028; G02B 3/08;
(Continued)

(56) References Cited

U.S. PATENT DOCUMENTS 6,469,241 B1 * 10/2002 Penn ........................ F24J 2/085
126/683
8,210,165 B2    7/2012 Forrester et al.

* cited by examiner

*Primary Examiner* — Euncha Cherry
(74) *Attorney, Agent, or Firm* — Buchanan Ingersoll & Rooney PC

(57) ABSTRACT

A compound polyhedral concentrator (CPOC) lens is disclosed with one smooth curved surface facing the sun and an inner surface comprised of a 3D pattern of interpenetrating minimum deviation prisms with a common origin facing the absorber. This new type of stationary solar concentrator is used to extend the acceptance angles by minimizing blocking and tip optical losses that are common with radial Fresnel design forms. Moreover, when considering the extended time period for non-tracking of the sun's movement commensurate with the increased acceptance angles the total energy collected using a combination of a CPOC lens and a photovoltaic device will be greater than the total energy collected using the photovoltaic device by itself.

16 Claims, 8 Drawing Sheets

(51) Int. Cl.
*H01L 31/054* (2014.01)
*F24J 2/08* (2006.01)
(52) U.S. Cl.
CPC ..... *G02B 19/0009* (2013.01); *G02B 19/0028* (2013.01); *H01L 31/0543* (2014.12); *Y02E 10/43* (2013.01); *Y02E 10/52* (2013.01)
(58) Field of Classification Search
CPC ..... G02B 5/045; F21V 5/04; F24J 2/08; F24J 2/085; H01L 31/0543; Y02E 10/52; Y02E 10/43
USPC .................. 359/837, 742; 126/683, 685–687
See application file for complete search history.

NON-IMAGING SOLAR CONCENTRATOR AND COSINE FACTOR CORRECTION DEVICE USING COMPOUND POLYHEDRAL SURFACES AND METHOD OF USE THEREOF

RELATED APPLICATIONS

This is a national phase application of PCT/US2014/015984, filed Feb. 12, 2014, which designates the United States, and which claims priority to U.S. Provisional Application No. 61/764,110, filed on Feb. 13, 2013. The entire contents of these applications are hereby incorporated by reference in their entireties.

FIELD

The present disclosure relates to the art of non-imaging solar concentrators. More particularly, the present disclosure relates to the art of extending acceptance angles for radial Fresnel lens designs to concentrate solar energy onto the surface of an absorber over longer periods in time without tracking the sun.

BACKGROUND

U.S. Pat. No. 8,210,165 B2 to Forrester, et al.

Depending on the angle of incidence, some ray paths through radial Fresnel lenses will be blocked by an adjacent prism's tip. In other cases, the prism tip may not be fully filled with light, as the groove height of the previous prism leads to rejection on the prism's back. Rays missing the absorber due to blocking losses $L_B$, or to unused tip losses $L_U$, along with transmittance losses, $\tau$, from first order reflections contribute to the total solar energy loss for these types of concentrators. The optical performance, or geometrical loss, is measured in terms of an optical efficiency, $\eta$, stating the ratio of solar rays hitting the absorber to the radiation incident on the outside of the lens, $I_{Incident}$, is $$\eta = 1 - (L_B + L_U + \tau)/I_{Incident} \quad (1)$$

Moreover multiplying the geometrical concentration ratio C with the optical efficiency allows for a direct comparison with other types of concentrators.

For a radial Fresnel lens the flux density on the absorber can be calculated by tracing the path of incident edge rays through each of the minimum deviation prisms to the absorber. Once geometrical losses are discounted from the initial flux, an effective width, $\omega_{Effective}$, of the prisms accounting for tip and blocking losses can be found. Transmittance losses $\tau$ accounting for first order reflections as a function of incidence angles are also deducted. The edge (maximum) rays for any combination of incidence angles are traced, and their intersections with the absorber plane are found in a cross sectional projection, resulting in a part of the absorber plane $\Delta d$ being illuminated. Depending on the distance of the prism from the absorber, a factor $\sigma$ describing the spread of the refracted beam is $$\sigma = \Delta d \cos(\gamma) \mu \quad (2)$$

The prism's height over the absorber plane defines the cosine losses of the beam when hitting the absorber at an angle $\gamma$ other than normal. Closer distance means higher flux density. A factor $\mu$ is introduced to describe this distance, normalized in respect to the lens height. This procedure is repeated for each prism i on both sides of the 2D lens. The two sides are not symmetric for any combination of incidence other than normal incidence. The resulting values are cumulated according to their location on the absorber. Thus, the flux density on any part of the absorber plane as a function of cross-sectional acceptance angle $\theta$ and perpendicular acceptance angle $\psi$, $\Delta\epsilon$ ($\theta_{Incident}, \psi_{Incident}$) is found as $$\Delta\epsilon(\theta_{Incident}, \psi_{Incident}) = \Sigma_{-i}^{i}(\omega_{Effective} \Delta d\tau \cos(\gamma)\mu) \quad (3)$$

Limitation on acceptance angles for a radial, non-tracking, Fresnel lens arises from the reduced effective prism widths due to blocking and tip-related solar energy losses common with this type of refractive concentrator design form.

SUMMARY OF THE INVENTION

The present invention concentrates electromagnetic energy (e.g., solar energy) onto an absorber through an extended range of acceptance angles using compound polyhedral structures that are comprised of polyhedrons that are themselves comprised of a 3D pattern of interpenetrating minimum deviation prisms sharing a common center.

DETAILED DESCRIPTION

Figure 1:
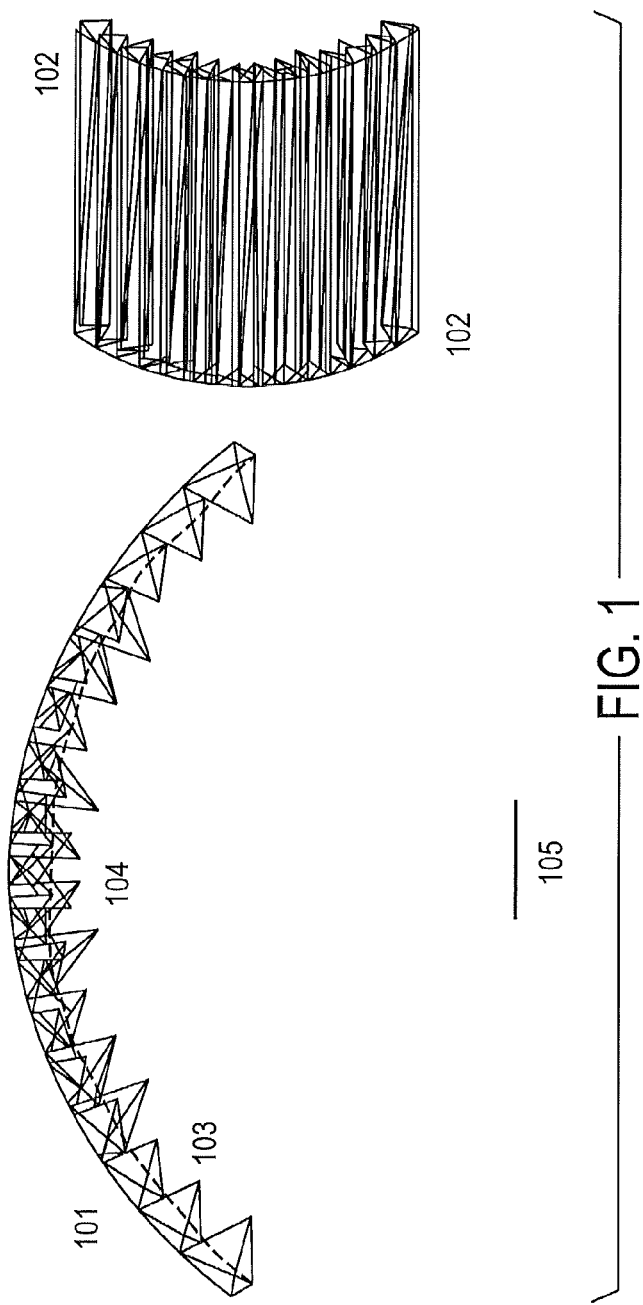
FIG. 1 is a cross-sectional view of one embodiment of a radial non-imaging compound polyhedral concentrator (CPOC) lens of the present invention comprised of a 3D pattern of interpenetrating minimum deviation prisms

FIG. 1 shows the compound polyhedral concentrator (herein referred to as the "CPOC" lens) has a first outer smooth curved surface 101, four side faces 102, and a second inner surface 103 formed by a 3D pattern of interpenetrating minimum deviation prisms 104. The outer curved surface 101 can have a circular, parabolic, elliptical, or hyperbolic profile. The design of the 3D surface patterns 104 of the inner second surface 103 increases the working range of acceptance angles for the CPOC lens by optimizing the flux incident onto an absorber 105. Minimum deviation prisms relate to prisms where the angle between the incidence ray and the first surface normal of the prism is identical to the angle between the transmitted ray and the second surface normal of the prism. The above description of the CPOC is not intended to limit the form factor or scope of the present invention, as, for instance, prisms could reside on both the input and output surfaces of the CPOC, instead of only the input surface as disclosed in FIG. 1.

To construct the inner surface sag of the CPOC lens adjacent vertices of a regular polyhedron compound can be connected to form a convex polyhedron termed the convex hull. The compound polyhedral surface profile is then a faceted representation of this convex hull. A regular polyhedron compound can be defined as a compound which, like a regular polyhedron, can be vertex-transitive, edge-transitive, or face-transitive. Contrary to stepped or Fresnel imaging designs, the 3D pattern of interpenetrating prisms in the present CPOC lens are not equal distant when assembled horizontally. Rather in the shaped version of the CPOC lens, each minimum deviation prism covers an angular segment similar to those formed by the spokes of a wheel, but without its circular shape. The number of interpenetrating prisms within a 3D pattern and their orientation in the shaped CPOC lens inner surface are calculated with the help of (3) under the restrictions of maximum groove depth, desired extended acceptance angular range, prism shape, linear density along two orthogonal directions, and concentration ratio. The shape of the prism faces comprising the interpenetrating 3D pattern maybe be triangular, rectangular, quadrilateral, pentagonal, hexagonal, heptagonal, octagonal, or other polyhedral 2D shape. The linear density of prisms along the cross-sectional direction and perpendicular to this direction can be different. The inner surface sag formed by the 3D patterns of interpenetrating prism maybe be spherical, elliptical, hyperbolic, parabolic, aspheric, or biconic. The materials used for the CPOC lens can be acrylic, polycarbonate, glass, or other suitable index of refraction thermoplastic material.

Figure 2:
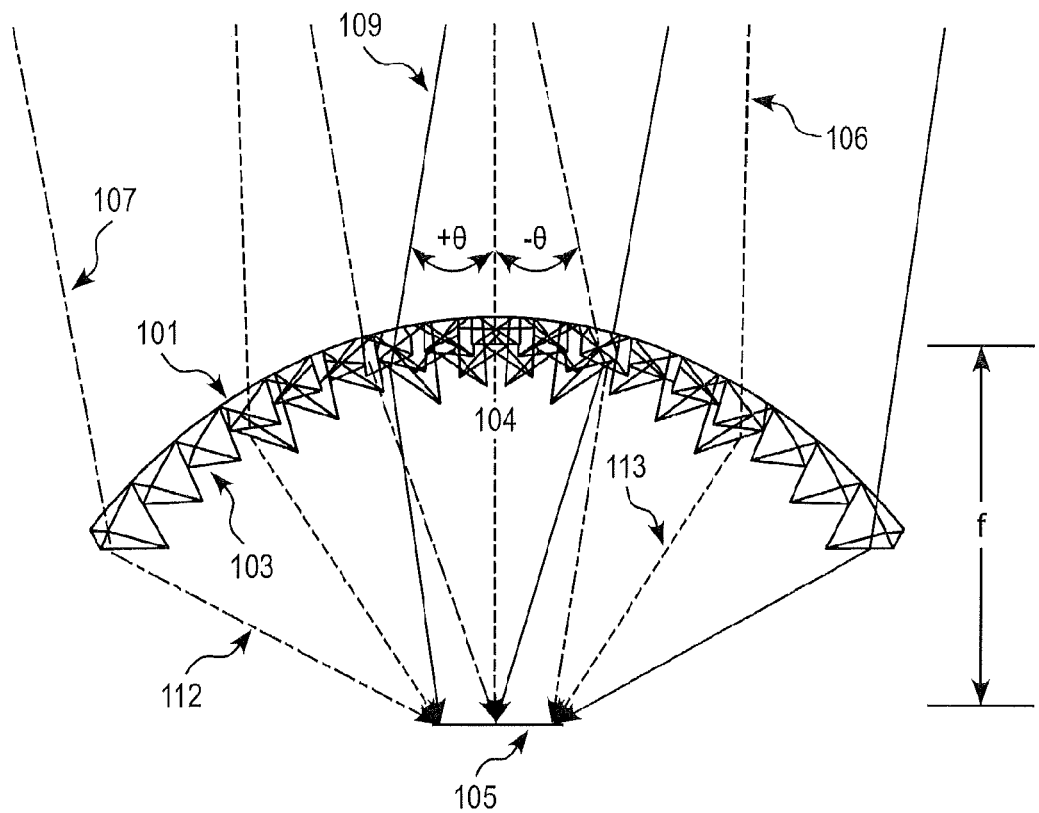
FIG. 2 shows ray tracing through a stationary CPOC lens of the present invention with increased acceptance angles

The stationary CPOC lens is designed to collect concentrated solar power over an extended period of time during the day commensurate with an increase in acceptance angles. Referring now to FIG. 2 solar rays incident onto the first smooth outer curved surface 101 of the stationary concentrator. These solar rays can be normal to 106, or form a positive incidence angle 107 in either of two orthogonal directions relative to the outer surface normal 108, or form a negative incidence angle 109 in either of two orthogonal directions relative to the outer surface normal 108, or the incidence angles of the solar rays can be any combination thereof. Only direct solar radiation contained within angles smaller or equal to the maximum acceptance half angles will, according to the edge ray principle, be refracted to the absorber 105. Edge rays 107, 109 entering the concentrator through the first outer curved surface 101 (entrance aperture of the optical system), with the maximum values for cross sectional acceptance angle 110, $\theta_{Max}$, and perpendicular acceptance angle 111, $\psi_{Max}$, leaves the second inner surface 103 profile comprised of a compound polyhedral structure 104 also as edge rays 112, 113 (exit aperture of the optical system) and will strike the outer edges of the absorber 105. Since the lens is symmetrically convex shaped, both rays entering the left and the right side of the CPOC lens can be refracted towards the absorber. The height f of the stationary CPOC lens directly above the center point of the absorber can be expressed as f=d/tan θ where d is the half-width of the absorber. Reflection losses of the concentrator are minimized by using minimum deviation prisms. The 3D surface pattern of interpenetrating polyhedral shaped prisms with a common center is designed to optimize the flux incident onto the surface of the absorber over an extended range of acceptance angles not possible with a radial non-imaging Fresnel lens so that the total integrated solar power for the same unit of time using the CPOC lens in combination with an absorber is greater than the total integrated power for the absorber by itself. The thickness of the small amount of substrate between the outer smooth surface 101 and the location of the polyhedron vertex common center reference surface 103 is dismissed as insignificant on the grounds of being very thin.

Figure 3:
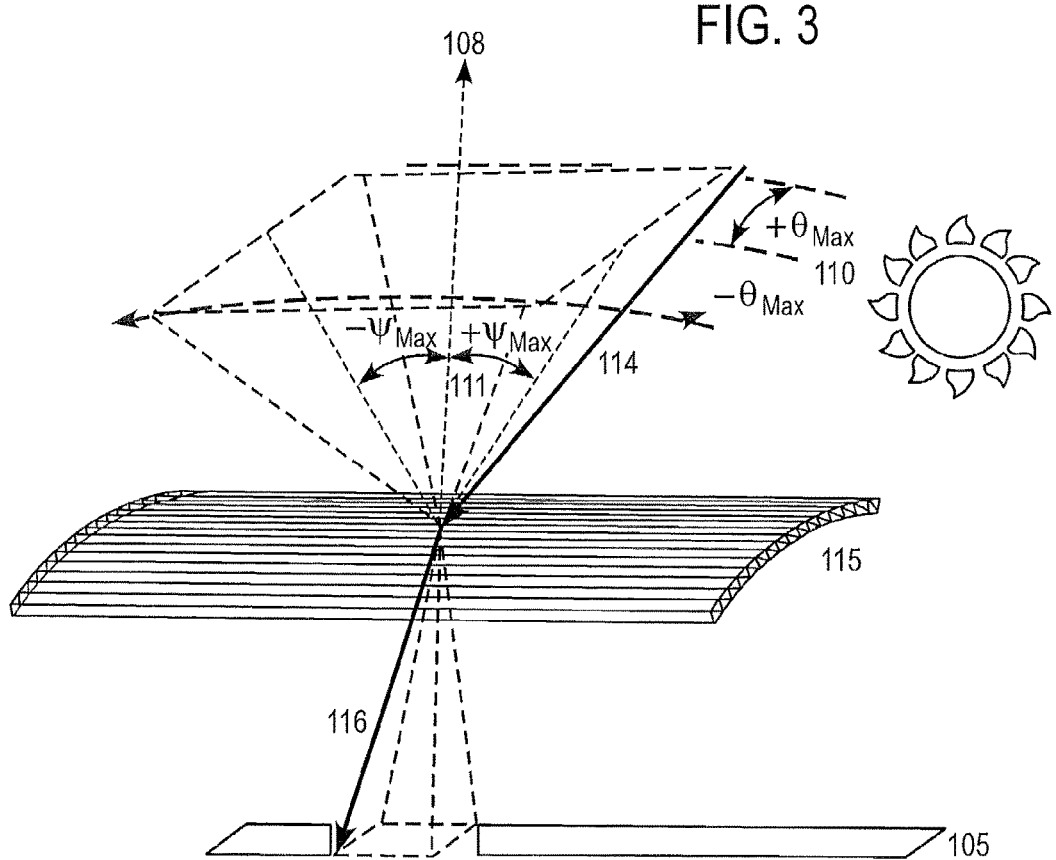
FIG. 3 is a perspective view of the ray tracing geometry corresponding to the edge ray principle of design for the CPOC lens of the present invention

Referring now to FIG. 3 shows the geometry for the edge ray principle for design of the CPOC lens. An edge rays 114 enters the concentrator 115 through the first outer curved surface 101 (entrance aperture of the optical system), with the maximum values for cross sectional acceptance angle 110, $\theta_{Max}$, and perpendicular acceptance angle 111, $\psi_{Max}$, leaves also as an edge ray 116 (exit aperture of the optical system) and will strike the outer edges of the absorber 105. Instead of designing the prisms to focus on one point, the prisms are constructed in such a way that refracted rays will hit parts of the absorber corresponding to the incidence angles, with rays entering at the acceptance half angles reaching the absorber at the very boundary of the flux footprint, which illuminates substantially 100% of the absorber's area, by design. Although minimum deviation happens only for one angle of incidence on each prism, symmetrical paths and the principle of the reversibility of light are the basic concepts of minimum deviation, the 'reversible' prisms described here are therefore considered as minimum deviation prisms.

Figure 4:
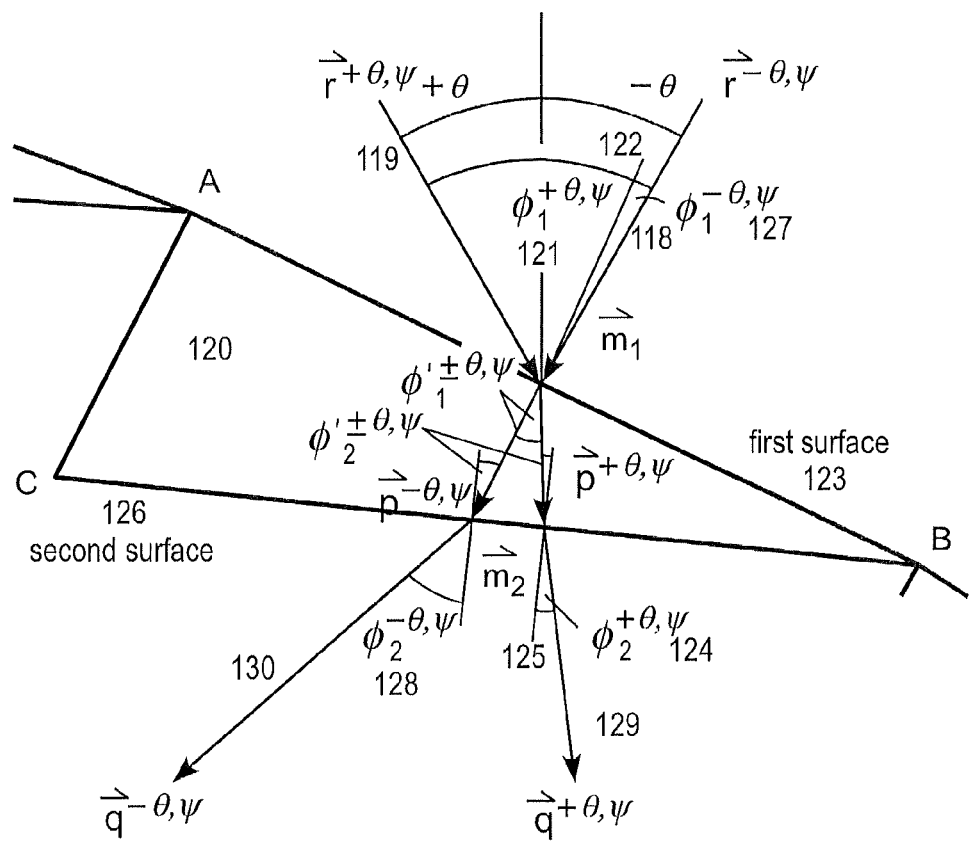
FIG. 4 is a side view of rays passing through an individual minimum deviation prism element within the compound polyhedral surface structure

Referring now to FIG. 4 shows the path of two representative rays 118 and 119 passing through a single prism element 120 of the compound polyhedral structured surface 104. For the left side incident ray 119 the maximum angle of incidence 121, $\phi_1+^{\theta\psi}$, relative to the normal 122 on the first prism surface 123, results in an angle of refraction 124, $\phi_2+^{\theta\psi}$, relative to the normal 125 on the second prism surface 126, where the latter approximately coincides with the right side incident ray 118 with the maximum angle of incidence 127, $\phi_1-^{\theta\psi}$, relative to the normal 122 on the first prism surface 123, and the former roughly equals the angle of refraction 128, $\phi_2-^{\theta\psi}$, relative to the normal 125 on the second prism surface 126. The two rays 129 and 130 exiting the second prism surface 126 are indicated.

Figure 5:
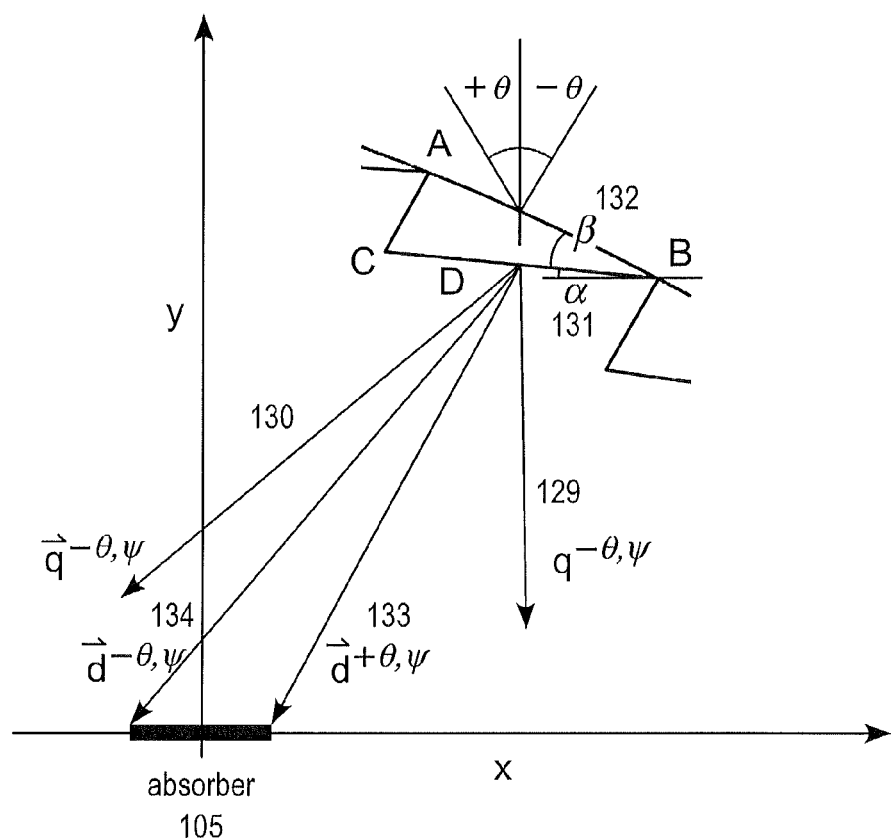
FIG. 5 is a side view of rays exiting each minimum deviation prism element of the present invention relative to the absorber

Referring now to FIG. 5 given the prism inclination angle α, 131 and the prism angle β, 132 for any of the prism elements within the compound polyhedral surface structure the orientation of this prism relative to the absorber 105 in relation to the direction of the refracted rays is given by a left refracted ray q+$^{\theta\psi}$ (129) and a right refracted ray q−$^{\theta\psi}$ (130). The prism position over the absorber is determined via two positioning vectors which describe the center point of the prism second face in its position to either the left end of the absorber d+$^{\theta\psi}$ (133), or right end of the absorber d−$^{\theta\psi}$ (134). Incidence on the prism from the left and right sides should hit the absorber after refraction within the limits of the right or the left end of the absorber, respectively. Each of the prisms comprising the 3D pattern of interpenetrating prism structure is designed in such a way that the edge ray principle is maintained. Thus, if the vector pair q−$^{\theta\psi}$ and d−$^{\theta\psi}$ as well as the vector pair q+$^{\theta\psi}$ and d+$^{\theta\psi}$ can be kept parallel, all rays leaving the prism after refraction will hit the absorber within its outer limits.

Figure 6:
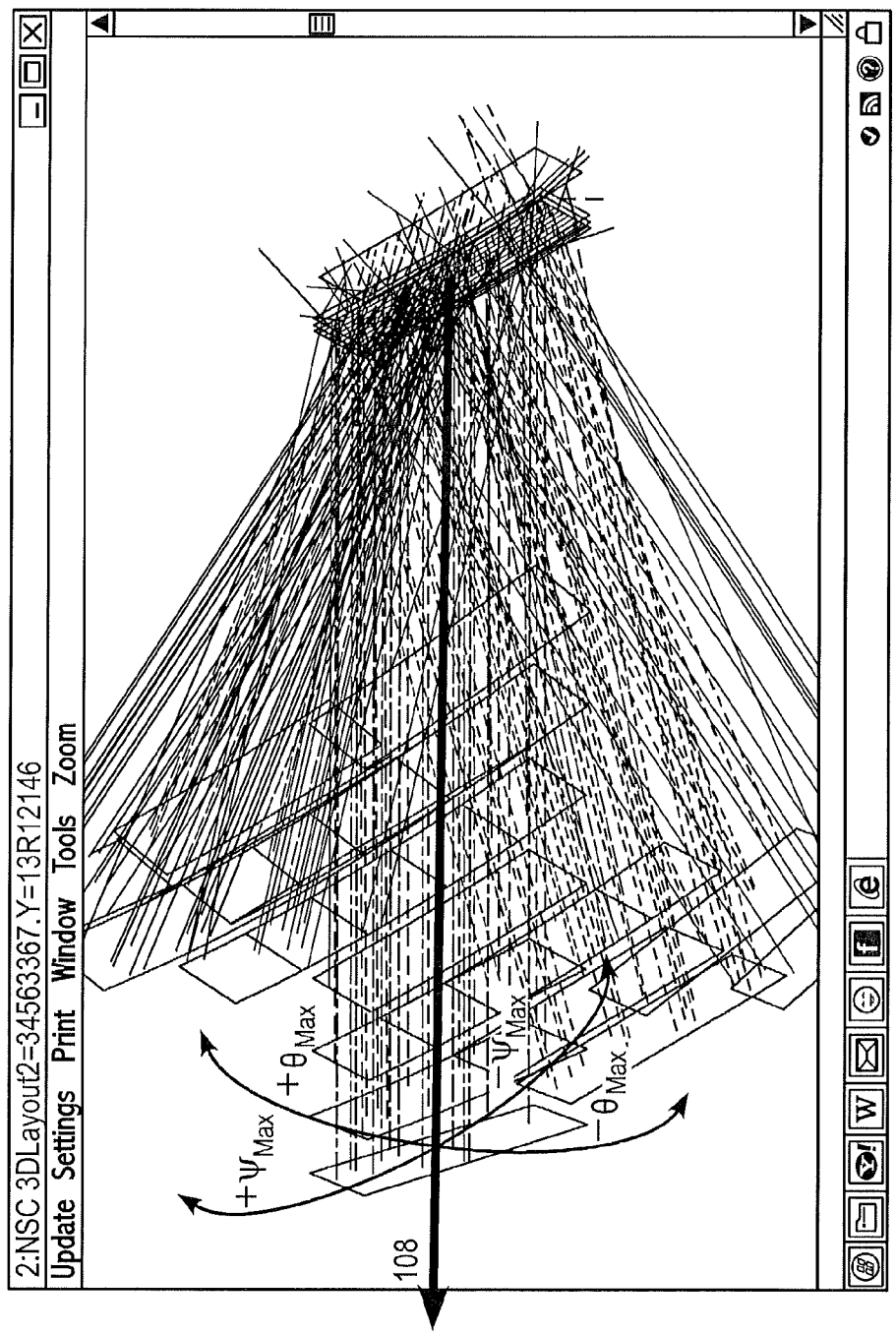
FIG. 6 is an example of Zemax ray tracing results used to analyze the performance of a stationary CPOC lens of one embodiment of the present invention in terms of increased acceptance angles

Referring now to FIG. 5 shows a layout of a representative Zemax simulation to study the concentration performance of the CPOC lens over the extended range of acceptance angles. By estimating the concentration ratio as a function of various positions of the sun allows an integration of the total solar energy captured by a photovoltaic module using a CPOC lens compared to the integration of the total solar energy captured by a standard flat panel over the same period of time. Referring to FIG. 6, a ray-tracing diagram showing the concentrating effect of the present invention when used in a fixed configuration, showing the output of the present invention under extreme angles of incidence due to the seasonal variations of the sun's path overhead.

Figure 7:
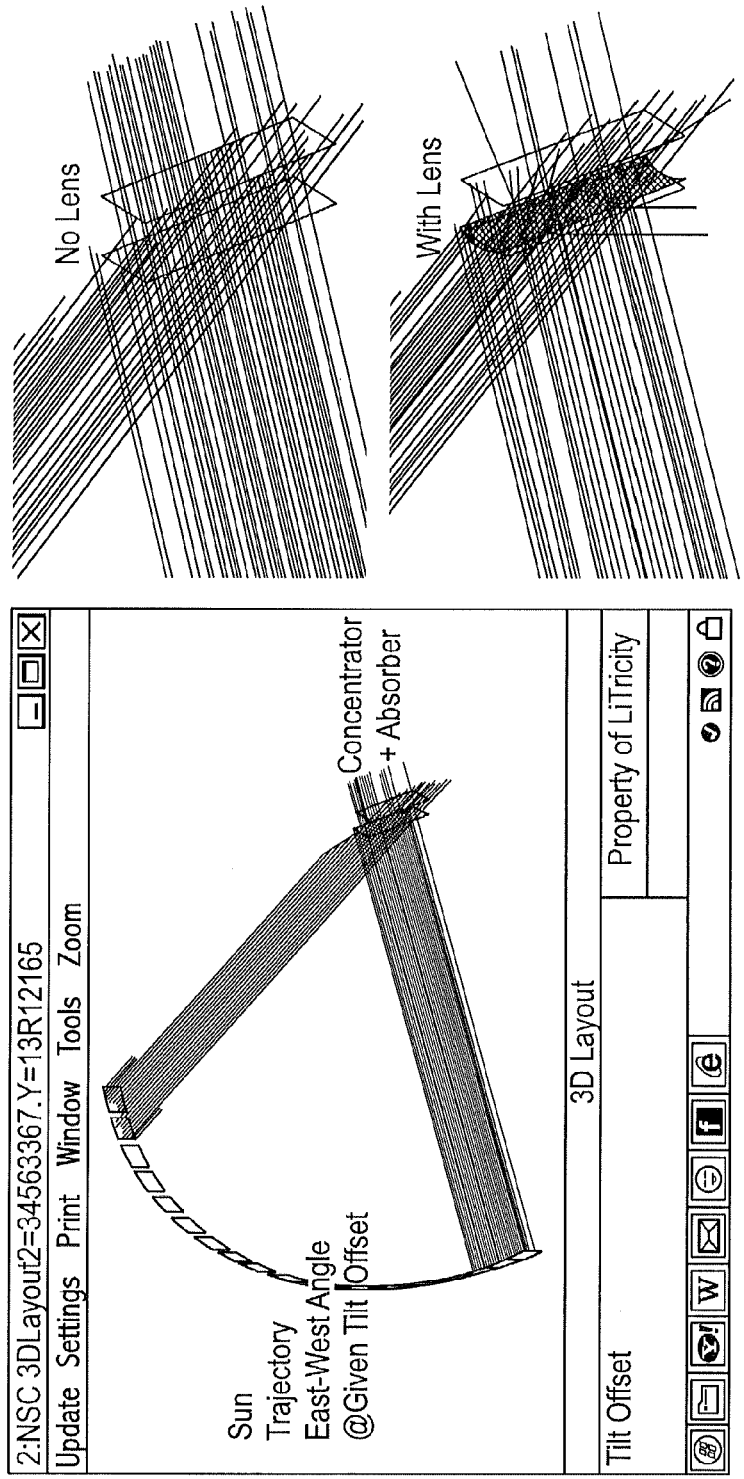
FIG. 7 is a ray tracing of a preferred embodiment of the present invention used as a "booster"

Referring to FIG. 7, a ray-tracing of a preferred embodiment of the present invention used as a "booster" to increase the output of a new or previously installed legacy "flat" photovoltaic panel which is "fixed" (i.e., not tracking the sun). The booster works by "correcting" for cosine factor output reduction during seasons when the sun is not overhead by decreasing the acceptance angle of the arriving sunlight, especially at extremely oblique angles of arrival (e.g., +/−50 degrees to +/−75 degrees from normal (in the North/South direction)) and also by leveraging the concentration functionality of the present invention wherein the now redirected light falls upon a portion of the photovoltaic cells substantially less than 100% of the area of said photovoltaic cells.

Figure 8:
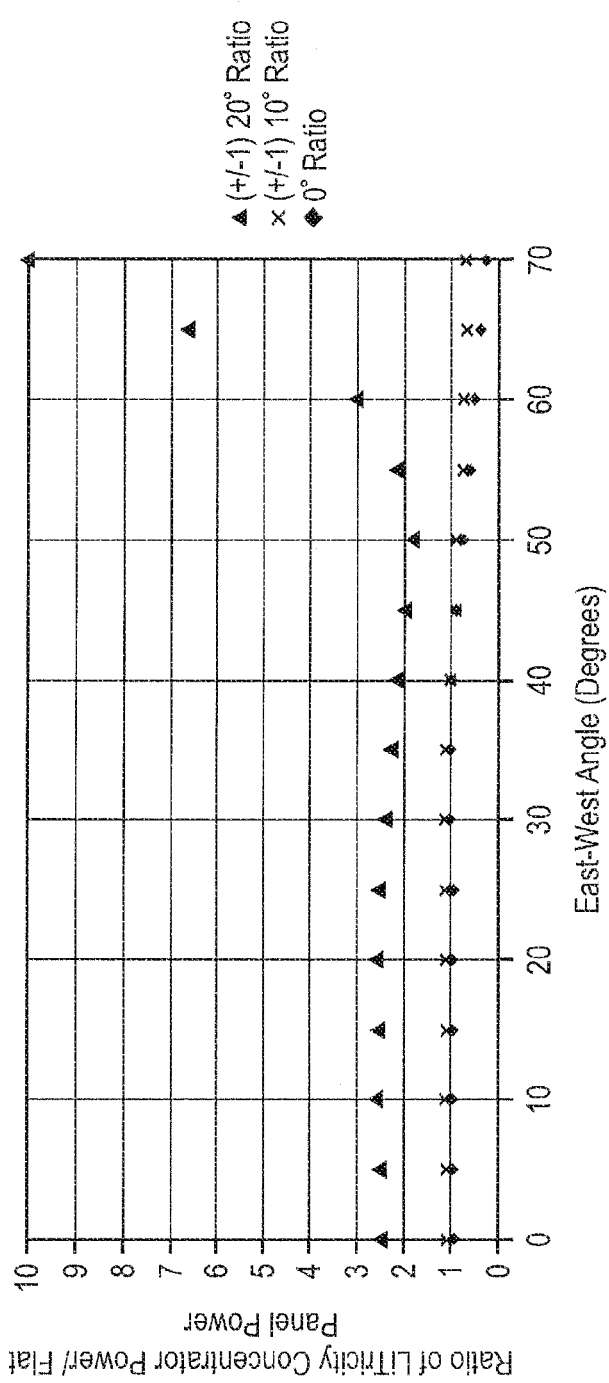
FIG. 8 is a graph describing the increased output of a legacy "flat" photovoltaic panel with one embodiment of the present invention used as an output "booster"

Referring to FIG. 8, a graph describing the increased output of a legacy "flat" photovoltaic panel with one embodiment of the present invention used as an output "booster", we see that a legacy flat photovoltaic panel can be made to produce more electricity (by having the amount incident light increased by the present invention) throughout the year, particularly at extreme angles, above +/−50 degrees from normal in the North/South direction.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

What is claimed is:

1. A combination electromagnetic energy concentrator and cosine factor corrector capable of concentrating electromagnetic energy over an extended range of acceptance angles, comprising:

a lens having an input surface onto which arriving electromagnetic energy is incident, a plurality of multi-faceted optical structures each configured to refract a plurality of different incident angles of the arriving electromagnetic energy, and an output surface from which the refracted electromagnetic energy is concentrated onto an absorber, wherein the multi-faceted optical structures each have a three-dimensional surface pattern of a first surface and a second surface, the second surface being arranged at an angle relative to the first surface such that the first and second surfaces each have a different normal angle of incidence relative to the arriving electromagnetic energy, wherein the multi-faceted optical structures are located on only the input surface, and wherein the second surface of the multi-faceted optical structures causes electromagnetic energy that arrives at the lens at an angle not near normal to the absorber to be refracted so as to arrive at an angle near normal to the absorber.

2. A combination electromagnetic energy concentrator and cosine factor corrector capable of concentrating electromagnetic energy, comprising:

a lens having an input surface onto which arriving electromagnetic energy is incident, a plurality of multi-faceted optical structures each configured to refract a plurality of different incident angles of the arriving electromagnetic energy, and an output surface from which the refracted electromagnetic energy is concentrated onto an absorber, wherein the multi-faceted optical structures each have a three-dimensional surface pattern of a first surface and a second surface, the second surface being arranged at an angle relative to the first surface such that the first and second surfaces each have a different normal angle of incidence relative to the arriving electromagnetic energy, wherein the multi-faceted optical structures are located on both the input surface and the output surface, and wherein the second surface of the multi-faceted optical structures causes electromagnetic energy that arrives at the lens at an angle not near normal to the absorber to be refracted so as to arrive at an angle near normal to the absorber.

3. The electromagnetic energy concentrator and cosine factor corrector of claim 1, wherein the energy being concentrated arrives at angles of incidence of about +/−15 degrees.

4. The electromagnetic energy concentrator and cosine factor corrector of claim 1, wherein the energy being concentrated arrives at angles of incidence of about +/−20 degrees.

5. The electromagnetic energy concentrator and cosine factor corrector of claim 1, wherein the energy being concentrated arrives at angles of incidence of about +/−25 degrees.

6. The electromagnetic energy concentrator and cosine factor corrector of claim 1, wherein the energy being concentrated is natural ambient direct sunlight.

7. The electromagnetic energy concentrator and cosine factor corrector of claim 1, wherein the energy being concentrated is natural ambient diffuse sunlight.

8. The electromagnetic energy concentrator and cosine factor corrector of claim 1, wherein the energy being concentrated arrives at near grazing incidence angles.

9. The electromagnetic energy concentrator and cosine factor corrector of claim 1, wherein the energy being concentrated arrives at angles of incidence between normal and grazing incidence.

10. The electromagnetic energy concentrator and cosine factor corrector of claim 2, wherein the energy being concentrated arrives at angles of incidence of about +/−15 degrees.

11. The electromagnetic energy concentrator and cosine factor corrector of claim 2, wherein the energy being concentrated arrives at angles of incidence of about +/−20 degrees.

12. The electromagnetic energy concentrator and cosine factor corrector of claim 2, wherein the energy being concentrated arrives at angles of incidence of about +/−25 degrees.

13. The electromagnetic energy concentrator and cosine factor corrector of claim 2, wherein the energy being concentrated is natural ambient direct sunlight.

14. The electromagnetic energy concentrator and cosine factor corrector of claim 2, wherein the energy being concentrated is natural ambient diffuse sunlight.

15. The electromagnetic energy concentrator and cosine factor corrector of claim 2, wherein the energy being concentrated arrives at near grazing incidence angles.

16. The electromagnetic energy concentrator and cosine factor corrector of claim 2, wherein the energy being concentrated arrives at angles of incidence between normal and grazing incidence.

\* \* \* \* \*